US006575765B2

(12) United States Patent
Gerbsch

(10) Patent No.: US 6,575,765 B2
(45) Date of Patent: Jun. 10, 2003

(54) INTERCONNECT ASSEMBLY FOR AN ELECTRONIC ASSEMBLY AND ASSEMBLY METHOD THEREFOR

(75) Inventor: Erich William Gerbsch, Cicero, IN (US)

(73) Assignee: Delphi Technologies, Inc., Troy, MI (US)

( * ) Notice: Subject to any disclaimer, the term of this patent is extended or adjusted under 35 U.S.C. 154(b) by 176 days.

(21) Appl. No.: 09/777,638

(22) Filed: Feb. 5, 2001

(65) Prior Publication Data

US 2002/0106912 A1 Aug. 8, 2002

(51) Int. Cl.[7] .......................... H01R 12/00; H05K 1/00
(52) U.S. Cl. .......................................... 439/66; 439/71
(58) Field of Search ............................ 439/66, 70, 71, 439/72, 73, 74, 68, 723

(56) References Cited

U.S. PATENT DOCUMENTS 5,173,205 A * 12/1992 Grabbe ........................ 439/66
5,455,459 A * 10/1995 Fillion et al. ............... 257/760
5,772,451 A * 6/1998 Dozier, II et al. ............ 439/70
5,939,739 A * 8/1999 O'Keefe ..................... 257/197

* cited by examiner

*Primary Examiner*—Brian Sircus
*Assistant Examiner*—Chandrika Prashad
(74) *Attorney, Agent, or Firm*—Jimmy L. Funke

(57) ABSTRACT

An interconnect assembly and method for a semiconductor device, in which the interconnect assembly can be used in lieu of wirebond connections to form an electronic assembly. The interconnect assembly includes first and second interconnect members. The first interconnect member has a first surface with a first contact and a second surface with a second contact electrically connected to the first contact, while the second interconnect member has a flexible finger contacting the second contact of the first interconnect member. The first interconnect member is adapted to be aligned and registered with a semiconductor device having a contact on a first surface thereof, so that the first contact of the first interconnect member electrically contacts the contact of the semiconductor device. Consequently, the assembly method does not require any wirebonds, but instead merely entails aligning and registering the first interconnect member with the semiconductor device so that the contacts of the first interconnect member and the semiconductor device make electrically contact, and then contacting the second contact of the first interconnect member with the flexible finger of the second interconnect member.

36 Claims, 3 Drawing Sheets

INTERCONNECT ASSEMBLY FOR AN ELECTRONIC ASSEMBLY AND ASSEMBLY METHOD THEREFOR

STATEMENT REGARDING FEDERALLY SPONSORED RESEARCH

This invention was made with Government support under NREL Subcontract No. ZAN-6-16334-01, under Prime Contract No. DE-AC36-98GO10337 awarded by the Department of Energy. The Government has certain rights in the invention.

TECHNICAL FIELD

The present invention generally relates to electrical interconnects. More particularly, this invention relates to an interconnect assembly and method for a semiconductor device, in which the interconnect assembly can be used in lieu of wirebond connections to form an electronic assembly.

BACKGROUND OF THE INVENTION

Wire bonding is a method well known in the art for making electrical connections to semiconductor devices. The technique typically entails the use of very thin electrically-conductive wires, often of aluminum or gold, which are bonded to bond pads on a device and conductors on a surface of the substrate to which the device is mounted. Suitable wire bonds can be achieved with various techniques, including thermosonic bonding and ultrasonic bonding. While widely used in the art, wire bonding has shortcomings. For example, wire interconnects are limited by the amount of current that the wires can carry, which is primarily a function of the cross-sectional area and electrical conductivity of the wire. Furthermore, the die geometries of certain semiconductor devices do not allow for multiple wire bonds, and wire bonds can be susceptible to fatigue failures caused by thermal cycling and fusing due to high current. The wire bond operation is also relatively time consuming, and therefore undesirable as the interconnect method for devices requiring a large number of interconnects. Making many ultrasonic wirebonds to a semiconductor device is also complicated by the risk of damage to the device. While statistical process control (SPC) of bond strengths using pull test data has been successfully employed to minimize some of the above shortcomings, alternative interconnect methods are continuously sought for applications where wire bonding and other conventional interconnect techniques are not well suited.

SUMMARY OF THE INVENTION

The present invention is directed to an interconnect assembly and method for a semiconductor device, in which the interconnect assembly can be used in lieu of wirebond connections to form an electronic assembly. Generally, the interconnect assembly includes first and second interconnect members. The first interconnect member has a first surface with a first contact and a second surface with a second contact electrically connected to the first contact, while the second interconnect member has a flexible finger adapted for contacting the second contact of the first interconnect member. The first interconnect member is adapted to be aligned and registered with a semiconductor device having a contact on a first surface thereof so that the first contact of the first interconnect member electrically contacts the contact of the semiconductor device. Consequently, the method of assembling an electronic assembly enabled by the present invention does not require any wirebonds, but instead merely entails aligning and registering the first interconnect member with the semiconductor device so that the contacts of the first interconnect member and the semiconductor device make electrical contact, and then contacting the second contact of the first interconnect member with the flexible finger of the second interconnect member. The first interconnect member is preferably configured to be self-aligning with the semiconductor device to facilitate the assembly process.

As described above, the interconnect assembly and method of this invention can be readily modified to include additional interconnect members similar to the first and/or second interconnect members. In addition, the first interconnect member (and any additional interconnect members similar thereto) may have multiple contacts on opposite surfaces, and the second interconnect member (and any additional interconnect members similar thereto) may have multiple fingers so that multiple interconnections can be simultaneously made to multiple contacts on a semiconductor device. The first and second interconnect members can also be used to make simultaneous electrical interconnects to any number of semiconductor devices of various types. These advantages of the invention are achieved with interconnect members that can be readily configured to avoid the various shortcomings noted for wirebonds, including limited current capacity, difficulties in simultaneously making interconnects with multiple contacts on certain die geometries, and susceptibility to fatigue failures caused by thermal cycling and fusing due to high current. In addition, the interconnect method is much less time consuming than conventional wire-bonding operations, and can be accomplished to produce a large number of interconnects to a semiconductor device with minimal risk of damage to the device.

Other objects and advantages of this invention will be better appreciated from the following detailed description.

DESCRIPTION OF THE PREFERRED EMBODIMENT

Figure 1:
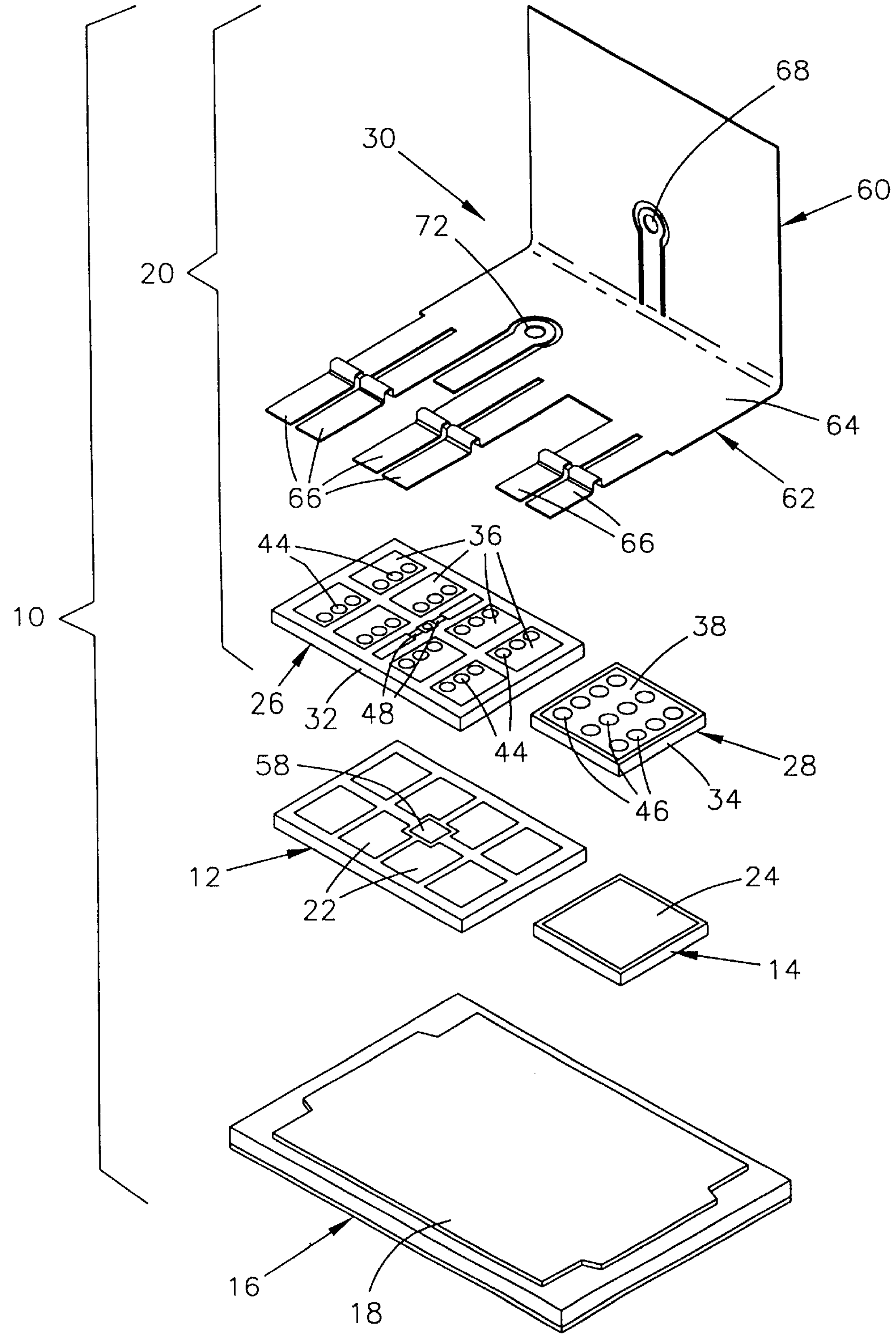
FIG. 1 is a perspective exploded view of a semiconductor assembly employing an interconnect assembly in accordance with the present invention.
Figure 2:
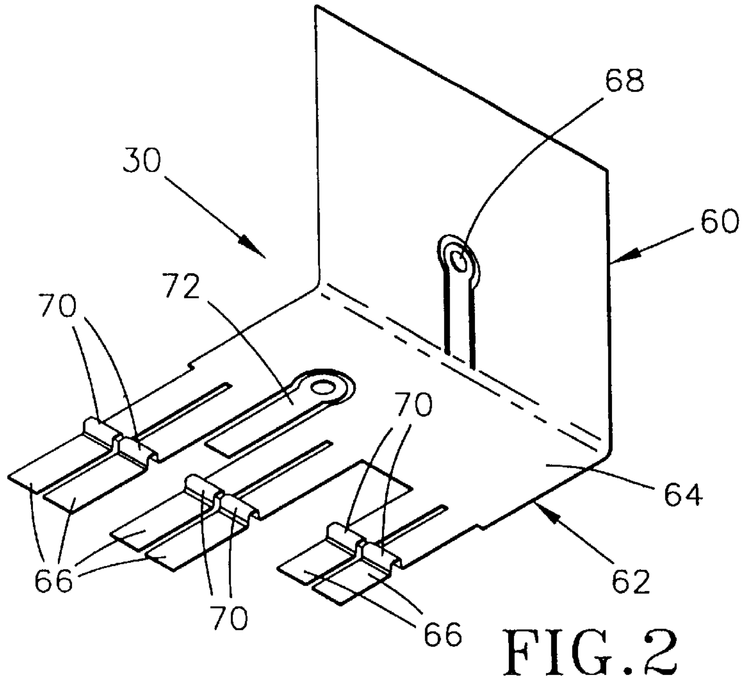
FIG. 2 is a perspective view of one of the interconnect members of the interconnect assembly of FIG. 1.

FIG. 1 represents an exploded view of a semiconductor module 10 in which two semiconductor devices 12 and 14 are mounted on a substrate assembly 16 and assembled with an interconnect assembly 20 in accordance with this invention. FIG. 1 also represents the manner in which the module 10 is assembled by placing the devices 12 and 14 on the substrate assembly 16, and then aligning and registering individual components of the interconnect assembly 20 with the devices 12 and 14. In one embodiment of the invention, the semiconductor devices 12 and 14 are an insulated gate bipolar transistor (IGBT) and a diode, respectively, though other devices could be employed with the invention.

As is conventional, the IGBT 12 and diode 14 may each be formed in a die of semiconductor material, such as silicon. The IGBT 12 is configured to have multiple emitter metallizations 22 on its upper surface and a collector region (visible in FIG. 1) on its lower surface, in accordance with known IGBT structures. The diode 14 has an upper terminal 24 on its top surface and a lower terminal (not visible in FIG. 1) on its lower surface. The substrate assembly 16 is shown as comprising a metallized layer 18 by which contact is made to the collector region of the IGBT 12 and the lower terminal of the diode 14 when the IGBT 12 and diode 14 are placed on, and preferably attached to, the substrate assembly 16. While the invention will be described in reference to the IGBT 12, diode 14 and substrate assembly 16, and these components of the module 10 are shown as having particular geometries, those skilled in the art will appreciate that the invention, and particularly the interconnect assembly 20, is not limited to any specific semiconductor devices and modules. Instead, the invention is more generally applicable to power transistors, diodes and MOSFET devices of various configurations, as well as other types of devices.

Figure 4:
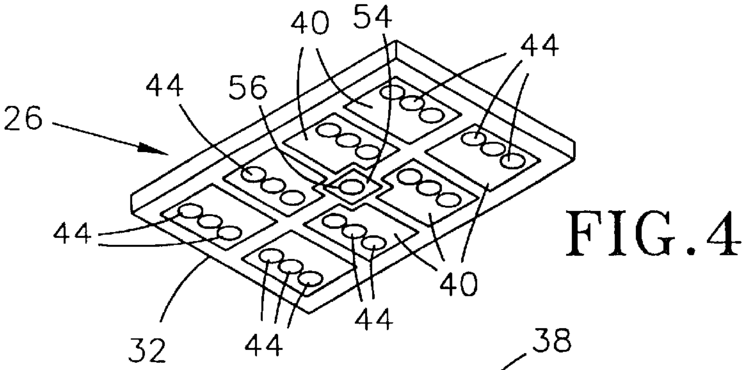
Figure 5:
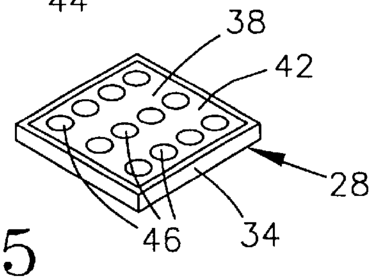
FIG. 5 is a perspective view of a lower surface of a third of the interconnect members of the interconnect assembly of FIG. 1.

The interconnect assembly 20 is shown in FIG. 1 as comprising three interconnects 26, 28 and 30, two of which (26, 28) are in the form of rectangular-shaped blocks while the third (30) is formed of a sheet-like material. The block-like interconnects 26 and 28 are preferably formed to have insulator substrates 32 and 34, respectively, having opposite metallized surfaces that define contact regions 36 and 38, respectively. The interconnect 26 is shown as having multiple contact regions 36, while the interconnect 28 is shown as having a single contact region 38, though other configurations are possible. As can be seen in FIGS. 4 and 5, the interconnects 26 and 28 have corresponding contact regions 40 and 42 on their respective lower surfaces. The contact regions 36, 38, 40 and 42 of the interconnects 26 and 28 are electrically connected with metallized vias 44 and 46 through their respective substrates 32 and 34, as shown. The interconnects 26 and 28 are each sized and shaped to be self-aligning with the IGBT 12 and diode 14, respectively, and so that their respective contacts 40 and 42 will align with and be individually registered with the emitter metallizations 22 of the IGBT 12 and the upper terminal 24 of the diode 14, respectively.

A suitable insulator material for the substrates 32 and 34 is alumina, though it is foreseeable that other dielectric materials could be used. To minimize thermal expansion mismatch within the module 10, preferred substrate materials for the interconnects 26 and 28 are those that have coefficients of thermal expansion near that of the semiconductor material(s) of the IGBT 12 and diode 14. The contact regions 36, 38, 40 and 42 and the metallizations with the vias 44 and 46 are preferably silver, and more preferably thick-film silver printed on the surfaces of the substrates 32 and 34 using known screen printing methods. Silver is preferred for its high electrical and thermal conductivity, solderability, and the ease with which thick films thereof can be printed. A suitable thickness for the thick-film silver of the contact regions 36, 38, 40 and 42 is about 12 to about 250 micrometers in order to promote the high-current capability of the contacts 36, 38, 40 and 42 and the metallized vias 44 and 46, though lesser and greater thicknesses are also foreseeable.

Figure 3:
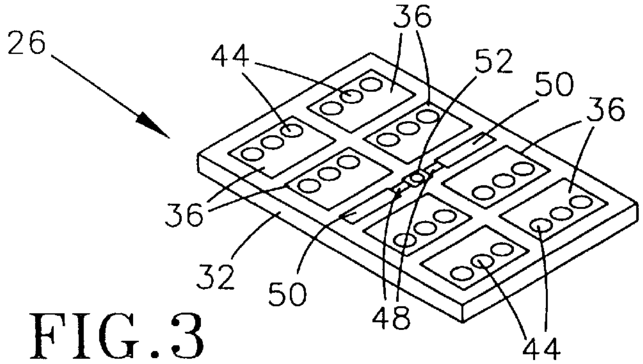
FIGS. 3 and 4 are perspective views of opposite surfaces of a second of the interconnect members of the interconnect assembly of FIG. 1.

FIGS. 1 and 3 show the interconnect 26 to the IGBT 12 as further including a pair of resistors 48, each with its own lateral contact 50 while sharing a single central contact 52. The central contact 52 is electrically connected to a contact 54 on the opposite surface of the interconnect 26 through a metallized via 56, similar in manner and construction to the other contacts 36 and 40 and vias 44 of the interconnect 26. The contact 54 on the lower surface of the interconnect 26 is intended for electrical connection to a gate contact 58 on the IGBT 12. Used in conjunction with the IGBT 12, the resistors 48 provide a gate resistor for the IGBT 12 that is up-integrated onto the interconnect 26, instead of a discrete gate resistor that would otherwise be formed on a separate substrate placed with the IGBT 12 and diode 14 on the substrate assembly 16. Consequently, the present invention enables the overall size of the module 10 to be reduced. Two resistors 48 are provided so that the interconnect 26 can be aligned and registered with the IGBT 12 without concern for the orientation of the interconnect 26 relative to the third interconnect 30, as will become evident from the following discussion of this interconnect 30.

Figure 6:
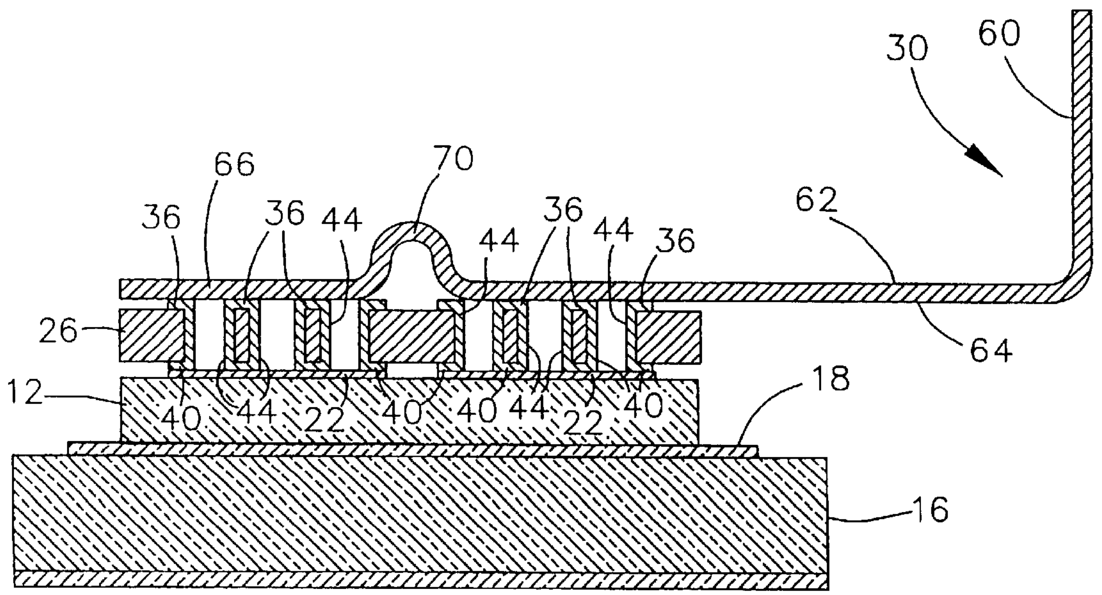
FIG. 6 is a cross-sectional view through the semiconductor assembly of FIG. 1.

The interconnect 30 differs from the other two interconnects 26 and 28 in its construction and function. The interconnect 30 is represented as being formed of a flexible conductive material, such as copper, though other materials could be used, including flex circuits with multiple conductors on a flexible substrate. A suitable thickness for the interconnect 30 is about 25 to about 250 micrometers if the material is copper, though lesser and greater thicknesses are foreseeable. The interconnect 30 is generally formed to have two portions 60 and 62 roughly perpendicular to each other. The lower portion 62 is generally planar and has a base region 64 from which a number of flexible parallel fingers 66 are cantilevered. As evident from FIG. 1, the interconnect 30 is aligned and registered with the interconnects 26 and 28 so that the base region 64 and fingers 66 are substantially parallel wits the interconnects 26 and 28 and aligned for contact with their respective contacts 36 and 38. The resulting structure is represented in FIG. 6, which is a cross-section longitudinally through one of the legs 66 contacting the inter connect 26. The upper portion 60 of the interconnect 30 has a cantilevered finger 68 by which electrical contact can be made to the interconnect 30, such as by soldering a wire. The finger 68 can be readily inclined away from the portion 60 to facilitate the electrical connection to the interconnect 30. The interconnect 30 is also shown as including a finger 72 detached from the upper and lower portions 60 and 62 so as not to be electrically connected to the remaining fingers 66. The purpose of the finger 72 is to make electrical contact to one of the lateral contacts 50 of the gate resistors 48, thereby providing a separate contact for charging the gate of the IGBT 12.

Because each of the fingers 66 is integral with the base region 64, they are all electrically connected to each other. As a result, electrical contact with the emitter metallizations 22 of the IGBT 12 and the upper terminal 24 of the diode 14 is made at the same potential. As shown, in each of the fingers 66 preferably has a fold or rib 70 formed between the locations of the fingers 66 where contact will be made with the individual contacts 36 of the interconnect 26. The function of the ribs 70 is to provide stress relief for differential thermal expansion between the interconnects 26, 28 and 30. The fingers 66 are aligned so that simultaneous contact can be made with the contacts 36 and 38 of the interconnects 26 and 28 simply be aligning and registering the interconnect 30 with the interconnects 26 and 28. The large surface areas of the fingers 66 making contact with the contacts 36 and 38 of the interconnects 26 and 28 promote uniform current extraction from the IGBT 12 and diode 14. The fingers 66 are preferably attached to the contacts 36 and 38, such as by printing a solder paste (not shown) on the contacts 36 and 38, and then heating to flow the paste in accordance with conventional practice.

While various methods of forming the interconnect 30 are possible, the interconnect 30 and each of its components 60, 62, 64, 66, 68 and 72 can be fabricated by stamping a copper sheet to shape, formed to define the shape shown in the Figures, and then nickel plated and gold flashed to promote the solderability thereof in accordance with known practice.

In view of the above, one can see that self-alignment of the interconnects 26 and 28 with the IGBT 12 and diode 14 is achieved by their corresponding sizes and shapes. Self-alignment is further promoted by the matching geometries of the solderable regions of the interconnects 26 and 28 (i.e., the contacts 40 and 42, respectively) and IGBT 12 and diode 14 (i.e., the emitter metallization 22 and upper terminal 24, respectively). As such the assembly process enabled by this invention is much less intensive than known wire-bonding processes. The module 10 shown in FIG. 1 can be assembled by printing solder on the metallized layer 18 of the substrate assembly 16 or on the lower surfaces (collector region and lower terminal, respectively) of the IGBT 12 and diode 14, placing the IGBT 12 and diode 14 on the substrate assembly 16, printing solder on the emitter metallization 22 and upper terminal 24 of the IGBT 12 and diode 14, registering the interconnects 26 and 28 with their respective IGBT 12 and diode 14, printing solder on the upper contacts 36 and 38 of the interconnects 26 and 28, registering the flexible interconnect 30 with the interconnects 26 and 28, and finally heating the resulting assembly to reflow solder the components of the module 10 together. During reflow, the matching geometries of the solderable areas of the components assist in achieving proper alignment, thereby significantly relaxing the precision of the assembly procedure.

While the invention has been described in terms of a preferred embodiment, it is apparent that other forms could be adopted by one skilled in the art. Accordingly, the scope of the invention is to be limited only by the following claims.

What is claimed is:

1. An electronic interconnect assembly comprising:

a first interconnect member having a first surface with a first contact and an oppositely-disposed second surface with a second contact electrically connected to the first contact; and a second interconnect member having a base portion, a second portion connected to the base portion, at least one flexible finger cantilevered from the base portion so as to be substantially parallel to the second surface of the first interconnect member, and at least a second finger cantilevered from the second portion so as not to be substantially parallel to the second surface of the first interconnect member, the flexible finger contacting the second contact of the first interconnect member.

2. The electronic interconnect assembly according to claim 1, wherein the first interconnect member comprises a planar block of a dielectric material, the first and second surfaces of the first interconnect member are opposite planar surfaces of the block, and the first and second contacts are formed by metal layers on the block.

3. The electronic interconnect assembly according to claim 2, wherein the first interconnect member further comprises a via between the first and second planar surfaces thereof and the first and second contacts are electrically interconnected by a metal layer on a wall of the via.

4. The electronic interconnect assembly according to claim 1, wherein the second interconnect member comprises a sheet of a conductive material, the base portion and the flexible finger are substantially parallel to the first interconnect member, and the second portion is not parallel to the base portion and the flexible finger.

5. The electronic interconnect assembly according to claim 1, wherein the flexible finger is soldered to the second contact of the first interconnect member.

6. The electronic interconnect assembly according to claim 1, wherein the second interconnect member further comprises a second finger not connected to the base portion or the flexible finger.

7. The electronic interconnect assembly according to claim 1, wherein the first interconnect member further comprises a third contact on the first surface thereof a central contact on the second surface thereof and electrically connected to the third contact, at least two lateral contacts separated by the central contact, a first resistor on the second surface and electrically connecting a first of the at least two lateral contacts to the central contact, and a second resistor on the second surface and electrically connecting a second of the at least two lateral contacts to the central contact, only one of the at least two lateral contacts being contacted by the second interconnect member.

8. The electronic interconnect assembly according to claim 1, wherein the first contact of the first interconnect member is one of a first plurality of contacts on the first surface of the first interconnect member, and the second contact of the first interconnect member is one of a second plurality of contacts on the second surface of the first interconnect member, and wherein the second plurality of contacts are electrically connected to the first plurality of contacts.

9. The electronic interconnect assembly according to claim 8, wherein the flexible finger of the second interconnect member contacts at least two of the second plurality of contacts of the first interconnect member.

10. The electronic interconnect assembly according to claim 9, wherein the first interconnect member comprises a planar block of a dielectric material, the first and second surfaces of the first interconnect member are opposite planar surfaces of the block, and the first and second plurality of contacts are formed by metal layers on the first and second planar surfaces of the first interconnect member.

11. The electronic interconnect assembly according to claim 10, wherein the via of the first interconnect member is one of a plurality of vias between the first and second planar surfaces of the first interconnect member, and the first and second plurality of contacts are electrically interconnected by metal layers on walls of the vias.

12. The electronic interconnect assembly according t claim 9, wherein the flexible finger has a rib between portions thereof contacting the a least two of the second plurality of contacts of the first interconnect member.

13. The electronic interconnect assembly according to claim 9, wherein the flexible finger of the second interconnect member is one of a plurality of parallel flexible fingers, and the parallel flexible fingers are electrically interconnected to each other and contact the second plurality of contacts of the first interconnect member.

14. The electronic interconnect assembly according to claim 1, further comprising a semiconductor device having a contact on a first surface thereof the first interconnect member being self-aligned and registered with the semiconductor device as a result of the first interconnect member corresponding in size and shape to the semiconductor device, so that the first contact electrically contacts the contact of the semiconductor device.

15. An electronic assembly comprising:

a semiconductor device mounted on a substrate assembly and having a plurality of contacts on a first surface thereof;

a first interconnect member self-aligned and registered with the semiconductor device as a result of the first interconnect member corresponding in size and shape to the semiconductor device, the first interconnect member having a first surface with a first plurality of contacts electrically contacting the plurality of contacts of the semiconductor device, and an oppositely-disposed second surface with a second plurality of contacts electrically connected to the first plurality of contacts of the first interconnect member; and a second interconnect member positioned so that the first interconnect member is between the second interconnect member and the semiconductor device, the second interconnect member comprising a sheet of a conductive material having a base portion and a plurality of parallel flexible fingers that are cantilevered from the base portion, substantially parallel to the first interconnect member, and contact the second plurality of contacts of the first interconnect member, the plurality of parallel flexible fingers being electrically interconnected with each other.

16. The electronic assembly according to claim 15, wherein the second interconnect member further has a second portion connected to the base portion and at least a second finger cantilevered from the second portion so as not to be substantially parallel to the first interconnect member.

17. The electronic assembly according to claim 15, wherein the first interconnect member further comprises a third contact on the first surface thereof a central contact on the second surface thereof and electrically connected to the third contact, at least two lateral contacts separated by the central contact, a first resistor on the second surface and electrically connecting a first of the at least two lateral contacts to the central contact, and a second resistor on the second surface and electrically connecting a second of the at least two lateral contacts to the central contact.

18. The electronic assembly according to claim 17, wherein the second interconnect member further comprises a finger not connected to the base portion or the plurality of parallel flexible fingers and contacting only one of the two lateral contacts of the first interconnect member.

19. The electronic assembly according to claim 15, wherein the first interconnect member comprises a planar block of a dielectric material, the first and second surfaces of the first interconnect member are opposite surfaces of the block, and the first and second plurality of contacts are formed by metal layers on the first and second surfaces of the first interconnect member.

20. The electronic assembly according to claim 19, wherein the first interconnect member further comprises vias between the first and second surfaces thereof, and the first and second contacts are electrically interconnected by metal layers on walls of the vias.

21. The electronic assembly according to claim 15, wherein the semiconductor device is a first semiconductor device of the electronic assembly, the electronic assembly further comprising:

a second semiconductor device mounted on the substrate assembly and having a contact on a first surface thereof; and a third interconnect member self-aligned and registered with the second semiconductor device as a result of the third interconnect member corresponding in size and shape to the second semiconductor device, the third interconnect member having a first surface with a first contact electrically contacting the contact of the second semiconductor device, and a second surface with a second contact electrically connected to the first contact of the third interconnect member;

wherein the second contact of the third interconnect member is contacted by at least one of the plurality of parallel flexible fingers of the second interconnect member.

22. The electronic assembly according to claim 21, wherein the first semiconductor device comprises a plurality of insulated gate bipolar transistors, and wherein the second semiconductor device comprises a diode.

23. The electronic assembly according to claim 22, wherein the plurality of contacts on the first surface of the first semiconductor device are emitter metallizations of the plurality of insulated gate bipolar transistors, the first semiconductor device further comprises a collector region on a second surface thereof, the contact on the first surface of the second semiconductor device is a first terminal of the diode, and the second semiconductor device further comprises a second terminal of the diode on a second surface thereof.

24. The electronic assembly according to claim 23, further comprising a conductor contacting the collector region of the plurality of insulated gate bipolar transistors and the second terminal of the diode.

25. A method of assembling an electronic assembly comprising a semiconductor device having a plurality of contacts on a first surface thereof the method comprising the steps of:

registering a first interconnect member with the semiconductor device, the first interconnect member self-aligning with the semiconductor device as a result of the first interconnect member corresponding in size and shape to the semiconductor device, the first interconnect member having a first surface with a first plurality of contacts electrically contacting the plurality of contacts of the semiconductor device, and a second surface with a second plurality of contacts electrically connected to the first plurality of contacts of the first interconnect member;

contacting the second plurality of contacts of the first interconnect member with flexible fingers of a second interconnect member so that the first interconnect member is between the second interconnect member and the semiconductor device, the second interconnect member comprising a sheet of a conductive material having a base portion from which the flexible fingers are cantilevered; and then heating the electronic assembly so as to bond the second plurality of contacts of the first interconnect member to the plurality of contacts of the semiconductor device and simultaneously bond the flexible fingers of the second interconnect member to the second plurality of contacts of the first interconnect member.

26. The method according to claim 25, wherein the heating step comprises soldering the flexible fingers to the second plurality of contacts of the first interconnect member.

27. The method according to claim 25, wherein the first interconnect member further comprises a third contact on the first surface thereof, a central contact on the second surface thereof and electrically connected to the third contact, at least two lateral contacts separated by the central contact, a first resistor on the second surface and electrically connecting a first of the at least two lateral contacts to the central contact, and a second resistor on the second surface and electrically connecting a second of the at least two lateral contacts to the central contact, the method further comprising the step of contacting only one of the at least two lateral contacts of the first interconnect member with a finger of the second interconnect member that is not connected to the base portion.

28. The method according to claim 25, wherein the first interconnect member comprises a planar block of a dielectric material, the first and second surfaces of the first interconnect member are opposite surfaces of the block, and the first and second plurality of contacts are formed by metal layers on the first and second surfaces of the first interconnect member.

29. The method according to claim 28, wherein the first interconnect member further comprises vias between the first and second surfaces thereof, and the first and second contacts are electrically interconnected by metal layers on walls of the vias.

30. The method according to claim 25, wherein the semiconductor device is a first semiconductor device of the electronic assembly, the method further comprising:

providing a second semiconductor device having a contact on a first surface thereof; and aligning and registering a third interconnect member with the second semiconductor device, the third interconnect member having a first surface with a first contact electrically contacting the contact of the second semiconductor device, and a second surface with a second contact electrically connected to the first contact of the third interconnect member;

wherein the contacting step includes contacting the second contact of the third interconnect member with at least one of the plurality of parallel flexible fingers of the second interconnect member.

31. The method according to claim 30, wherein the third interconnect member is sized and shaped to be self-aligned with the second semiconductor device during the aligning and registering step.

32. The method according to claim 30, wherein the first semiconductor device comprises a plurality of insulated gate bipolar transistors and the second semiconductor device comprises a diode, the plurality of contacts on the first surface of the first semiconductor device are emitter metallizations of the plurality of insulated gate bipolar transistors, We first semiconductor device further comprises a collector region on a second surface thereof, the contact on the first surface of the second semiconductor device is a first terminal of the diode, and the second semiconductor device further comprises a second terminal of the diode on a second surface thereof.

33. The method according to claim 32, further comprising the step of contacting the collector region of the plurality of insulated gate bipolar transistors and the second terminal of the diode with a conductor.

34. The method according to claim 25, wherein, a second portion connected to the base portion, at least one flexible finger cantilevered from the base portion so as to be substantially parallel to the second surface of the first interconnect member, and at least a second finger cantilevered from the second portion so as not to be substantially parallel to the second surface of the first interconnect member, the flexible finger contacting the second contact of the first interconnect member.

35. The method according to claim 25, wherein as a result of the contacting step, at least one of the flexible fingers of the second interconnect member contacts at least two of the second plurality of contacts of the first interconnect member.

36. The method according to claim 35, further comprising the step of providing the at least one of the flexible fingers with a rib between portions thereof contacting the at least two of the second plurality of contacts of the first interconnect member.

* * * * *